(12) United States Patent
Tamura

(10) Patent No.: US 6,233,658 B1
(45) Date of Patent: May 15, 2001

(54) MEMORY WRITE AND READ CONTROL

(75) Inventor: Youichi Tamura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/088,515

(22) Filed: Jun. 2, 1998

(30) Foreign Application Priority Data

Jun. 3, 1997 (JP) .................................................. 9-145493

(51) Int. Cl.[7] ............................. G06F 12/06; G06F 13/00
(52) U.S. Cl. ......................... 711/150; 345/192; 345/196; 345/204; 345/511; 345/512; 345/517; 345/521; 711/5; 711/101; 711/147; 711/148; 711/149; 711/151; 711/154; 711/167; 711/168
(58) Field of Search .............................. 345/132, 99, 204, 345/516, 186, 192, 196, 509, 512, 517, 521; 711/167, 168, 5, 101, 147–151, 154

(56) References Cited

U.S. PATENT DOCUMENTS 5,049,865 * 9/1991 Nakamura et al. ..................... 345/60
5,307,085 * 4/1994 Nakamura .............................. 345/99

OTHER PUBLICATIONS

Unexamined Patent Application Publication (Kokai) No. 60-022878.*
Unexamined Patent Application Publication (Kokai) No. 06-266831.*
Unexamined Patent Application Publication (Kokai) No. 07-192125.*
Japanese Office Action dated Aug. 10, 1999 with cited references Japanese wavy line material and English translation thereof.
European Patent Application No. 0 536 758 A1.
European Patent Application No. 0 530 759 A2.
European Patent Application No. 0368 572.
European Patent Application No. 0 065 365.

* cited by examiner

Primary Examiner—Than Nguyen
(74) Attorney, Agent, or Firm—Laff, Whitesel & Saret, Ltd.; J. Warren Whitesel

(57) ABSTRACT

A memory control system includes a frame memory divided into N image memories. Serial input image data are sequentially written into the N image memories in rotation. Then, image data is concurrently read from each of the N image memories depending on a desired read position to produce N image data in parallel. The N image data are sorted to produce consecutive N image data in parallel.

10 Claims, 9 Drawing Sheets

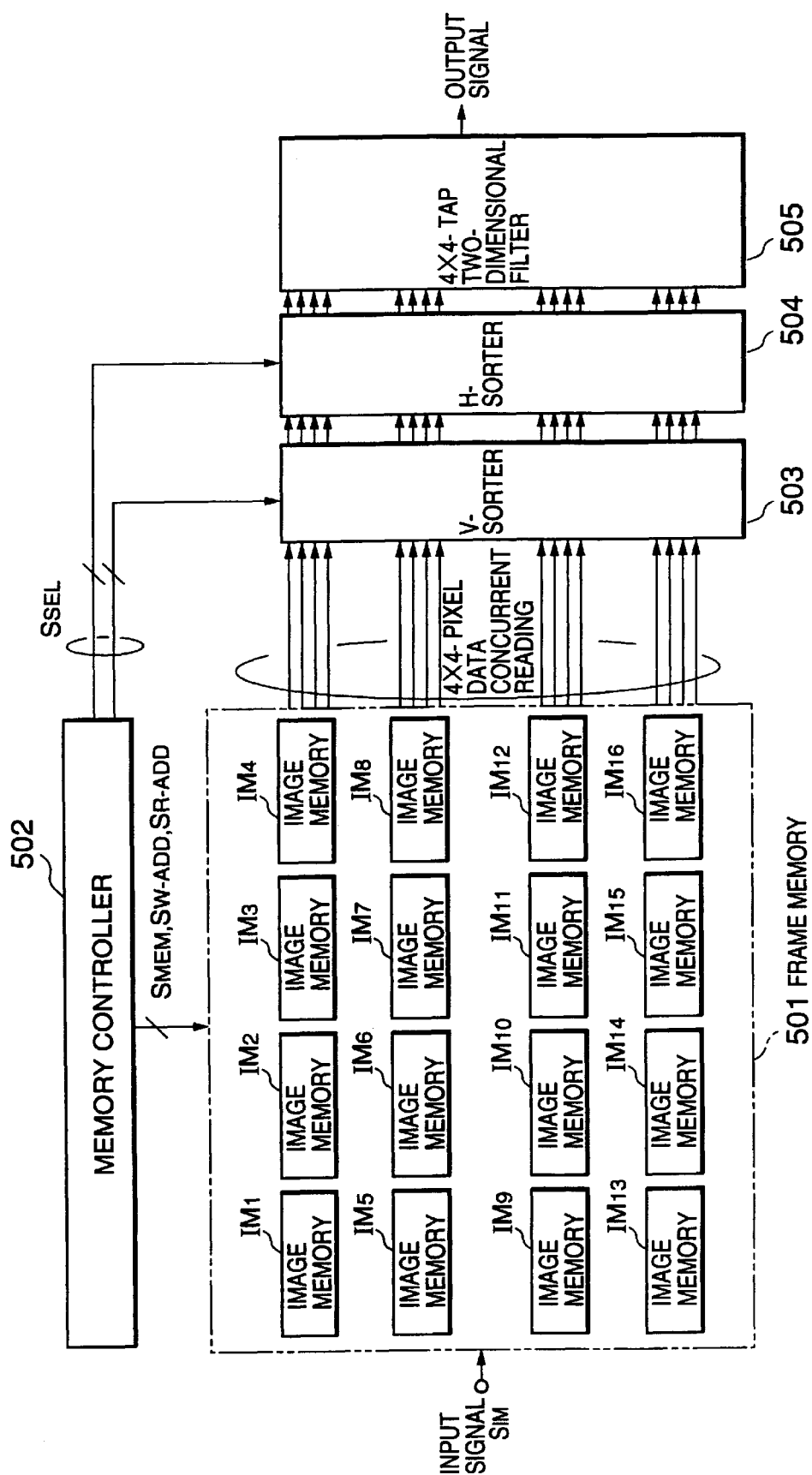

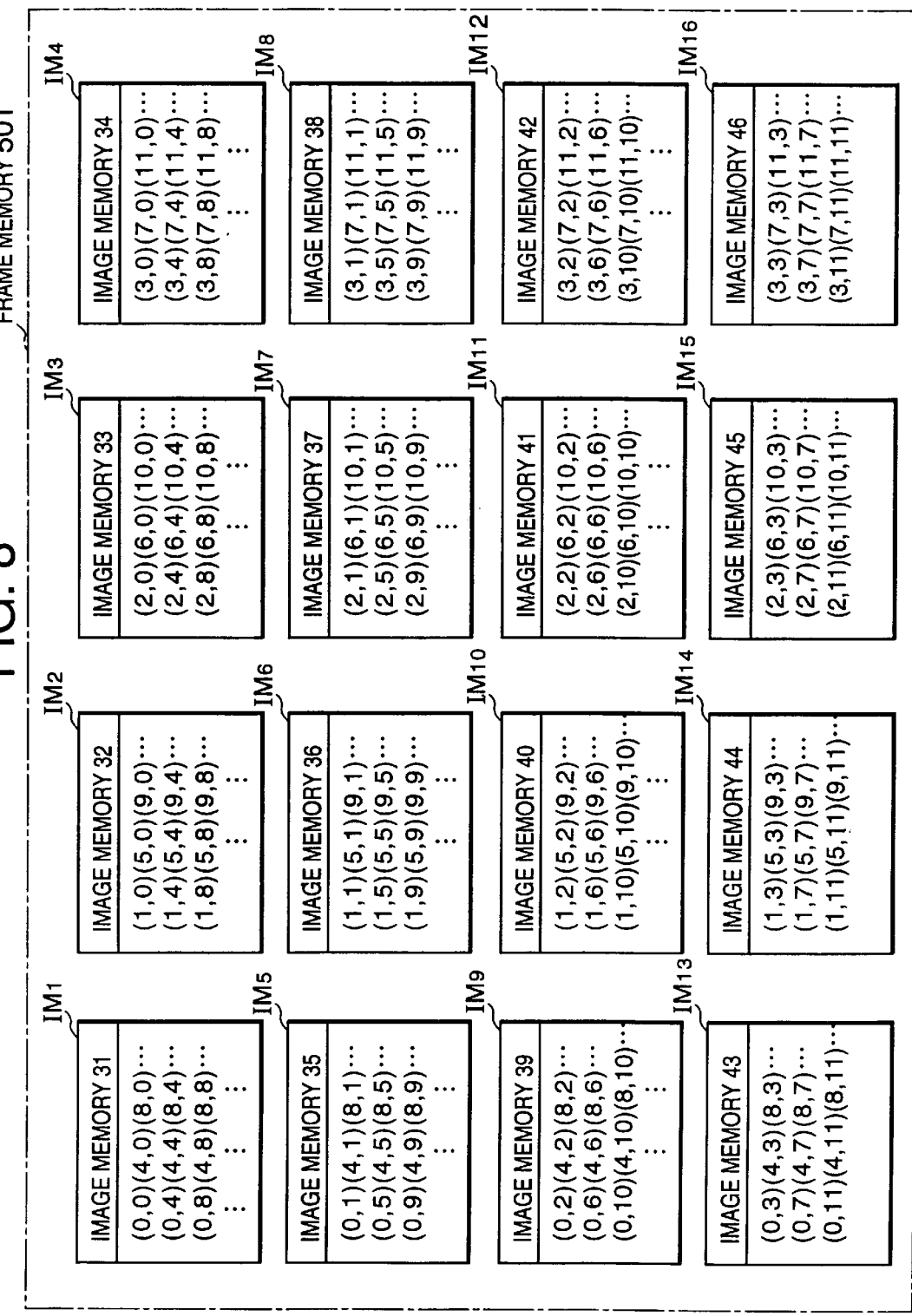

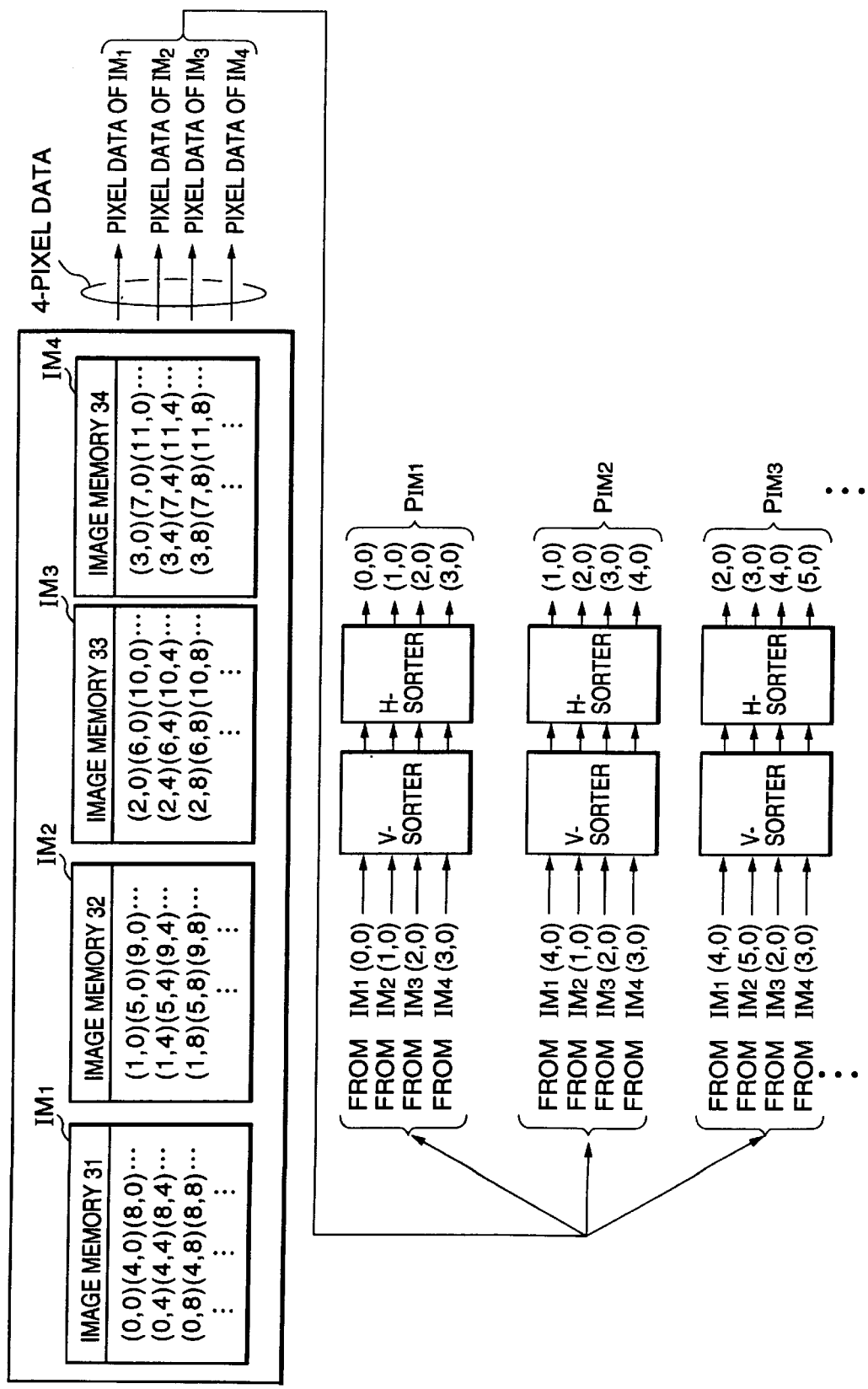

MEMORY WRITE AND READ CONTROL

BACKGROUND OF THE INVENTION

1. Field of the Invention

The present invention generally relates to memory control and in particular to memory write and read control for producing parallel consecutive output data from serial input data.

2. Description of the Related Art

In the field of image processing, image filtering for resolution conversion or enhancing contrast is usually performed by using a filter having parallel input taps and a single output. Therefore, it is necessary to convert serial image data to parallel and consecutive image data.

In general, such parallel consecutive image data can be produced by data tapped from a plurality of line buffers or flip-flops which are connected in serial.

Since undesired input pixel data are, however, sequentially transferred to the parallel input taps of the filter, it is necessary to select desired input pixel data by controlling the line buffers or the flip-flops. Further, there are cases where the filtered pixel data are not sequentially produced. Therefore an output buffer following the filter is needed.

SUMMARY OF THE INVENTION

An object of the present invention is to provide a memory control method and system which can produce consecutive parallel data from serial input data without the need of line buffers or flip-flops.

Another object of the present invention is to provide a memory control method and system which can produce the consecutive parallel image data of a desired image part with simplified configuration.

According to the present invention, a plurality of memories are controlled by write and read controllers. The write controller sequentially writes serial data onto the memories in rotation, and the read controller concurrently reads data from each of the memories to produce a predetermined number of consecutive data in parallel. The serial data may be data blocks or dot data.

According to the present invention, a memory control system is comprised of a frame memory divided into N image memories each indicated by $IM_I$, where N and I are an integer and $0 \leq I \leq N-1$. Serial image data are sequentially written onto the N image memories in rotation. Then, image data is concurrently read from each of the N image memories depending on a desired read position to produce consecutive N image data in parallel.

The serial image data may be sequentially written onto the N image memories such that K-th image data is written onto an image memory $IM_I$ so as to satisfy $K=N \times Q(K/N)+I$, where $Q(K/N)$ is a quotient of K/N. P-th image data may be read from the image memory $IM_I$ such that P is one selected from $Q(P/N)$ and $Q(P/N)+1$ depending on $R(P/N)$, where $R(P/N)$ is a remainder of P/N.

The image data may be concurrently read from each of the N image memories to produce N image data in parallel, and then the N image data may be sorted to produce consecutive N image data in parallel.

According to the present invention, a memory control system is comprised of a frame memory divided into M×N image memories each indicated by $IM_{(I, J)}$, where M, N, I and J are an integer, $0 \leq I \leq M-1$ and $0 \leq J \leq N-1$. A write controller sequentially writes serial image data (D(X, Y) onto the M×N image memories in rotation, wherein a set of X and Y indicates a position of a frame of input image data. A read controller concurrently reads image data from each of the M×N image memories depending on a desired read position to produce consecutive M×N image data in parallel.

As described above, the serial data are sequentially written onto the memories in rotation, and are concurrently read from each of the memories to produce a predetermined number of consecutive data in parallel. Therefore, the consecutive parallel image data can be obtained without the need of line buffers, flip-flops or output buffer.

Further, image data is concurrently read from each of the N image memories depending on a desired read position to produce consecutive N image data in parallel. More specifically, the P-th image data may be read from the image memory $IM_I$ such that P is one selected from $Q(P/N)$ and $Q(P/N)+1$ depending on $R(P/N)$, where $R(P/N)$ is a remainder of P/N. Therefore, the consecutive parallel image data of a desired image part may be obtained with simplified configuration.

BRIEF DESCRIPTION OF THE DRAWINGS

FIG. 7 is a block diagram showing an image memory control system according to the second embodiment of the present invention;

FIG. 8 is a schematic diagram showing the pixel data stored in a frame memory of the image memory control system as shown in FIG. 7; and FIG. 9 is a schematic diagram showing a part of operation of the second embodiment as shown in FIG. 7.

DETAILED DESCRIPTION OF THE PREFERRED EMBODIMENTS

Figure 1:
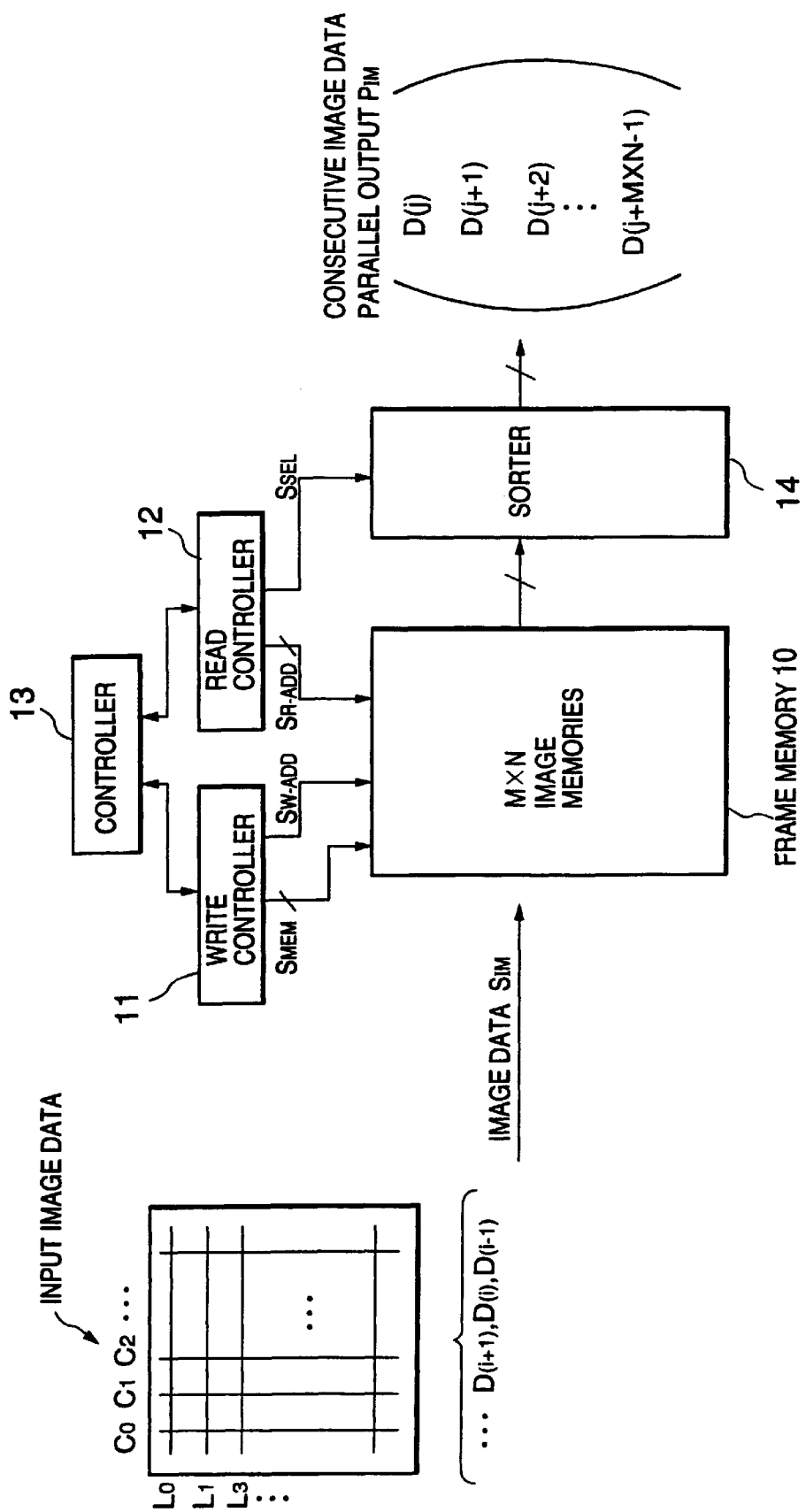
FIG. 1 is a block diagram showing an image memory control system according to the present invention.

Referring to FIG. 1, an image memory control system according to the present invention is comprised of a frame memory 10 and a memory controller including a write controller 11, a read controller 12 and a controller 13. The frame memory 10 includes M×N image memory chips where M and N are an integer greater than 1. Alternatively, the frame memory 10 may be horizontally and vertically divided by M and N, respectively, to form M×N memory areas.

A frame of input image data has a predetermined number of horizontal lines each having a predetermined number of pixels. The image data $S_{IM}$ are sequentially input and stored onto the frame memory 10 under control of the write controller 11 and then the stored image data are read in parallel from the frame memory 10 under control of the read controller 12, as well be described later. The parallel image data are transferred to a sorter 14 which sorts them under control of the read controller 12.

More specifically, after the image data $S_{IM}$ have been written onto the frame memory 10, the read controller 12 can read image data of a desired part of the stored image frame data in parallel. The parallel image data are sorted in consecutive line or pixel order. The consecutive parallel image data $P_{IM}$ are output to a parallel-tap filter (not shown).

Hereinafter, the basic configuration and operation of the image memory control system will be described taking as an example four image memories included in the frame memory 10 for simplicity.

Figure 2:
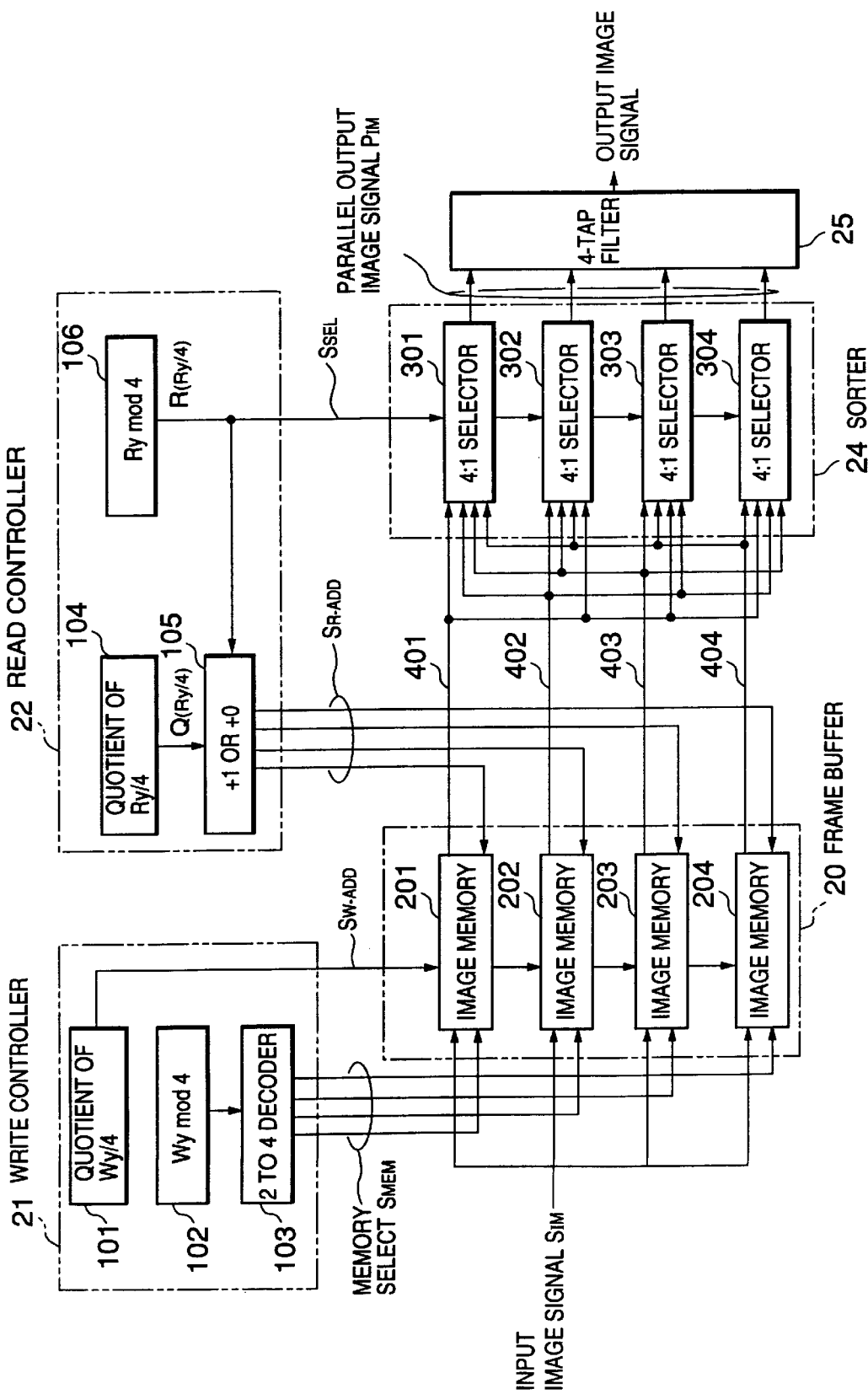
FIG. 2 is a detailed block diagram showing a vertical controller of an image memory control system according to a first embodiment of the present invention.

Referring to FIG. 2, a frame buffer 20 is controlled by a write controller 21 and a read controller 22 using a vertical line position Wy (0, 1, 2, . . . ) of the input image frame received from the controller 13. The parallel output data of the frame buffer 20 is sorted by a sorter 24 using a select signal $S_{SEL}$ and the consecutive parallel image data $P_{IM}$ are output to the 4-tap filter 25.

The frame buffer 20 includes four image memories 201–204. The input image data are selectively written onto the image memories 201–204 depending on a memory select signal $S_{MEM}$ and a common write address signal $S_{W-ADD}$. The respective image data of the image memories 201–204 are concurrently read depending on the read address signal $S_{R-ADD}$ and the parallel image data outputs 401–404 are transferred to the sorter 24.

The sorter 24 includes four 4:1 selectors 301–304. The respective outputs 401–404 of the image memories 201–204 are connected to the 4×4 inputs of the 4:1 selectors 301–303 in rotational order. For example, the output 401 of the first image memory 201 is connected to the first input of the 4:1 selector 301, the fourth input of the 4:1 selector 302, the third input of the 4:1 selector 303 and the second input of the 4:1 selector 304. The output 402 of the second image memory 202 is connected to the first input of the of the 4:1 selector 302, the fourth input of the 4:1 selector 303, the third input of the 4:1 selector 304 and the second input of the 4:1 selector 301. Similarly, other outputs 403 and 404 are connected to the 4:1 selectors 301–304.

Each 4:1 selector can select one of the four outputs 401–404 of the image memories 201–204 depending on the select signal $S_{SEL}$ so that the consecutive parallel image data are produced from the parallel outputs 401–404 to be output to the 4-tap filter 25.

WRITE CONTROL

The write controller 21 performs the write control of the image memories 201–204 by outputting the memory select signal $S_{MEM}$ and the common write address signal $S_{W-ADD}$. The common write address signal $S_{W-ADD}$ is the quotient produced by dividing the vertical line position Wy by four (101). Hereinafter, such a quotient will be referred to as Q(Wy/4). The memory select signal $S_{MEM}$ is produced by decoding the remainder of Wy/4 (102, 103). Hereinafter, such a remainder will be referred to as R(Wy/4). More specifically, when R(Wy/4)=0, the memory select signal $S_{MEM}$ is '1000' by which the first image memory 201 is selected. When R(Wy/4)=1, the memory select signal $S_{MEM}$ is '0100' by which the second image memory 202 is selected. Similarly, When R(Wy/4)=2 and 3, the memory select signals $S_{MEM}$ are '0010' and '0001' by which the third and fourth image memories 203 and 204 are selected, respectively.

For example, when the second vertical line L1 indicated by Wy=1 is designated, the quotient Q(1/4) is 0 and the remainder R(1/4) is 1. Therefore, the common write address signal $S_{W-ADD}$ is 0 and the memory select signal $S_{MEM}$ is '0100'.

Figure 3:
FIG. 3 is a schematic diagram showing the line data stored in a frame buffer of the vertical controller shown in FIG. 2.

Referring to FIG. 3, the above-mentioned write control cause the input image data to be written onto the image memories 201–204 of the frame buffer 20. In this figure, the ROW address is the common write address signal $S_{W-ADD}$ corresponding to Q(Wy/4). More specifically, the first to fourth vertical lines L0–L3 of the input image data are stored onto the first address (ROW address =0) of the first to fourth image memories 201–204, respectively, and then the fifth vertical line L4 of the input image data is stored onto the second address (ROW address=1) of the first image memory 201. In this manner, the image memory 201 stores image line data of L0, L4, L8, . . . , and the image memory 202 stores image line data of L1, L5, L9, . . . . It is the same with other image memories. In general, assuming that an i-th image memory of N image memories is represented by $IM_{(i)}$ where i=0, 1, 2, . . . , N–1, the i-th image memory $IM_{(i)}$ stores image line data of vertical line L(N×Q(Wy/N)+1).

READ CONTROL

Figure 4:
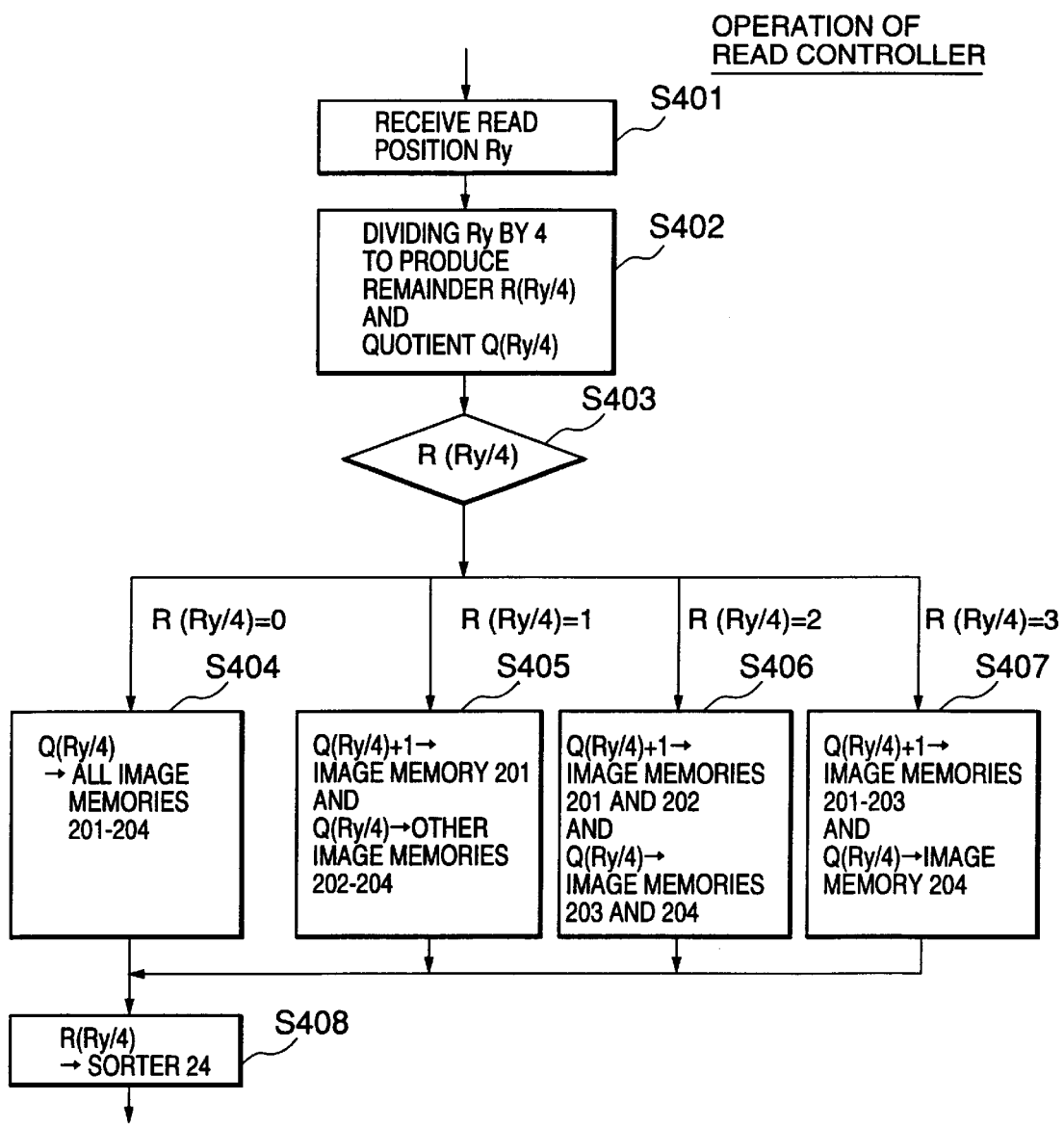
FIG. 4 is a flow chart showing the read control operation of a read controller in the vertical controller shown in FIG. 2.

The read controller 22 performs the read control of the image memories 201–204 by producing the read address signal $S_{R-ADD}$ and the select signal $S_{SEL}$ as shown in FIG. 4.

Referring to FIG. 4, when receiving a read vertical position Ry from the controller 13 (step S401), the read controller 12 divides the read vertical position Ry by four to calculate the remainder R(Ry/4) and the quotient Q(Ry/4) (step S402 or see steps 104 and 106 of FIG. 2). The quotient Q(Ry/4) is used to produce the read address $S_{R-ADD}$ of the image memories 201–204 and the remainder R(Ry/4) is used to selectively change the address values of the read address $S_{R-ADD}$ corresponding to the image memories 201–204, respectively (see step 105 of FIG. 2).

More specifically, it is determined which one of 0, 1, 2 and 3 is equal to R(Ry/4) (step S403). When R(Ry/4)=0, the quotient Q(Ry/4) is output as read address to all the image memories 201–204 (step S404). When R(Ry/4)=1, the quotient Q(Ry/4) is incremented by one and the result is output as read address to the image memory 201 and further the quotient Q(Ry/4) is output as read address to the other image memories 202–204 (step S405). When R(Ry/4)=2, the quotient Q(Ry/4) is incremented by one and the result is output as read address to the image memories 201 and 202, and further the quotient Q(Ry/4) is output as read address to the other image memories 203 and 204 (step S406). When R(Ry/4)=3, the quotient Q(Ry/4) is incremented by one and the result is output as read address to the image memories 201–203, and further the quotient Q(Ry/4) is output as read address to the remaining image memory 204 (step S407).

The remainder R(Ry/4) is also output as the select signal $S_{SEL}$ to the 4:1 selectors 301–304 of the sorter 24 (step S408). When R(Ry/4)=0, each of the 4:1 selectors 301–304 selects the first input. When R(Ry/4)=1, each of the 4:1 selectors 301–304 selects the second input. When R(Ry/4)= 2, each of the 4:1 selectors 301–304 selects the third input. And, when R(Ry/4)=3, each of the 4:1 selectors 301–304 selects the fourth input. The details of the operation will be described hereinafter.

OPERATIONS

Figure 5:
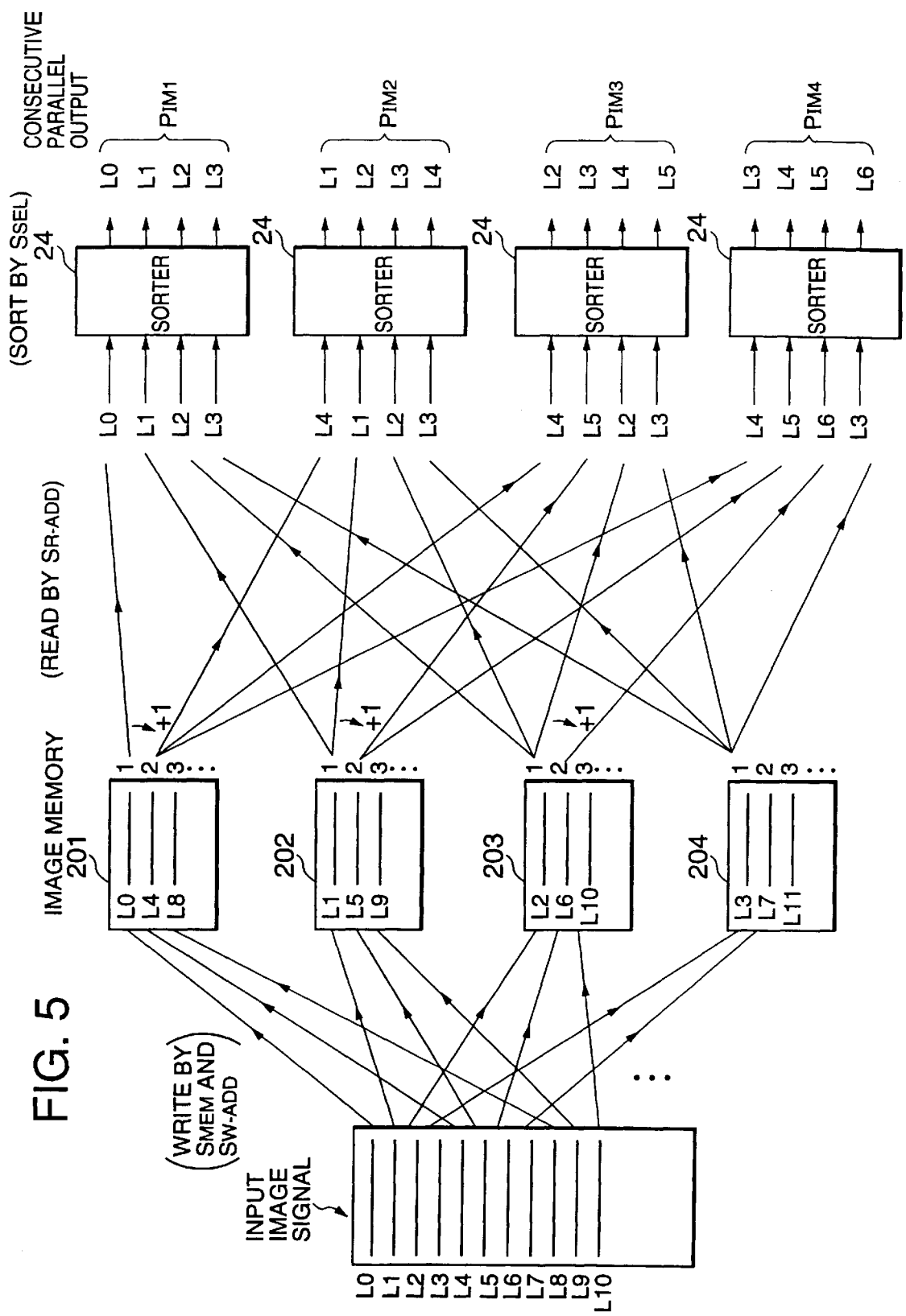
FIG. 5 is a schematic diagram showing an operation of the vertical controller shown in FIG. 2.

Referring to FIG. 5, the lines L0, L1, L2, . . . of the input image data are stored onto the image memories 201–204 according to the memory select signal $S_{MEM}$ and the common write address signal $S_{W-ADD}$ as described in FIG. 3. For example, the image memory 201 stores image line data of L0, L4, L8, . . . , and the image memory 202 stores image line data of L1, L5, L9, . . . .

Assuming a read vertical position Ry=0 is designated after a frame of the input image data has been stored onto the image memories 201–204, both R(Ry/4) and Q(Ry/4) are 0. Therefore, the first address (Q(Ry/4)=0) of each image memory are accessed and the respective image data of L0, L1, L2, and L3 are output from the image memories 201–204 to the sorter 24. Since the 4:1 selectors 301–304 of the sorter 24 are set to the first-input selection state when R(Ry/4)=0, the L0–L3 image data are output in the order presented. That is, the image data of L0, L1, L2, and L3 are output as the consecutive parallel output data $P_{IM1}$ to the 4-tap filter 25.

In the case of the read vertical position Ry=2, as another example, R(Ry/4)=2 and Q(Ry/4)=0. Therefore, the second addresses (Q(Ry/4)+1=1) of the image memories 201 and 202 are accessed, respectively, and the respective image data of L4 and L5 are output from the image memories 201 and 202 to the sorter 24. On the other hand, the first addresses (Q(Ry/4)=0) of the image memories 203 and 204 are accessed, respectively, and the respective image data of L2 and L3 are output from the image memories 203 and 204 to the sorter 24. Since the 4:1 selectors 301–304 of the sorter 24 are set to the third-input selection state when R(Ry/4)=2, the parallel image data of L4, L5, L2 and L3 are sorted into consecutive parallel image data $P_{IM3}$ of L2, L3, L4 and L5 which are output to the 4-tap filter 25. It is the same with other read vertical positions.

As described above, the consecutive parallel vertical image data corresponding to a desired vertical position are obtained. Using the same method as described above, consecutive parallel horizontal image data can be obtained by only replacing the write vertical position Wy and the read vertical position Ry with write horizontal position Wx and read horizontal position Rx. respectively.

SECOND EMBODIMENT

Figure 6:
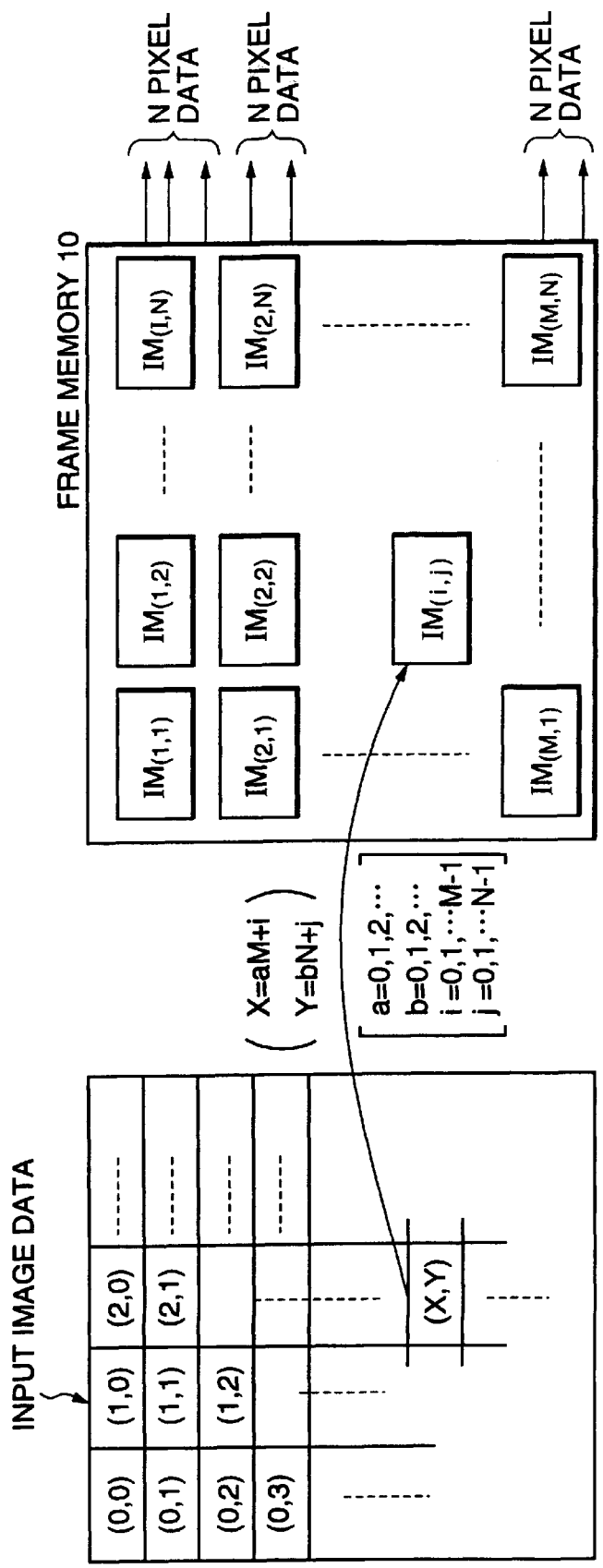
FIG. 6 is a schematic diagram showing a general write control in the image memory control system of FIG. 1.

Referring to FIG. 6, the frame memory 10 includes M×N image memories $IM_{(1, 1)}$–$IM_{(M, N)}$. In this system, pixel data of a position (X, Y) in the input image data is stored onto an image memory determined by the position (X, Y). More specifically, the pixel data of a position (X, Y) is stored onto an image memory $IM_{(i, j)}$ according to the relationship of X=aM+i and Y=bN+j, where a is Q(X/M) and b is Q(Y/N). Taking the case of M=N =4 as an example, the details will be described with reference to FIG. 7.

Referring to FIG. 7, a frame memory 501 includes 4×4 image memories $IM_1$–$IM_{16}$ which are controlled by a memory controller 502. The respective 4×4 image memories $IM_1$–$IM_{16}$ of the frame memory 501 output 4×4 parallel pixel data to a sorter consisting of a vertical sorter 503 and a horizontal sorter 504 which are controlled by the memory controller 502. Each of the vertical sorter 503 and the horizontal sorter 504 includes 4×4 selectors as in the case of FIG. 2. The sorter outputs 4×4 consecutive parallel pixel data to 4×4-tap two-dimensional filter 505. The write control of the frame memory 501 is performed as shown in FIG. 6. The read control of the frame memory 501 and the select control of the sorter are basically the same as in the case of the first embodiment.

As shown in FIG. 8, the pixel data of a position (X, Y) in the input image data is stored onto an image memory determined by the position (X, Y) as shown in FIG. 6. For example, the image memory $IM_I$ stores pixel data of positions (4Q(X/4). 4(Q(X/4)). More specifically, pixel data of positions (0, 0), (4, 0), (8, 0), . . . are stored onto the first row of the image memory $IM_I$, pixel data of positions (0, 4), (4, 4), (8, 4), . . . are stored onto the second row, and so on. The image memory $IM_2$ stores pixel data of positions (4Q (X/4)+1, 4(Q(Y/4)). More specifically, pixel data of positions (1, 0), (5, 0), (9, 0), . . . are stored onto the first row, pixel data of positions (1, 4), (5, 4), (9, 4), . . . are stored onto the second row, and so on.

Referring to FIG. 9, pixel data is concurrently read from each of 4×4 image memories $IM_1$–$IM_{16}$ of the frame memory 501 according to the control method as shown in FIG. 5. In the case of the image memories $IM_1$–$IM_4$, assuming a read position (X, Y)=(0, 0) is designated after a frame of the input image data has been sorted onto the image memories $IM_1$–$IM_{16}$, R(X/4), Q(X/4). R(Y/4), and Q(Y/4) are all 0. Therefore, the first address (Q(Ry/4)=0) of each image memory are accessed and the respective pixel data of (0,0), (1,0), (2,0), and (3,0) are output from the image memories $IM_1$–$IM_4$ to the sorter. Since the sorter is set to the first-input selection state when R(X/4)=R(Y/4)=0, the respective pixel data of (0,0), (1,0), (2,0), and (3,0) are output as the consecutive parallel output data $P_{IM1}$ to the filter 505.

In the case of the read position (X, Y)=(2, 0), as another example, R(X/4)=2 and Q(X/4)=0, and R(Y/4)=Q(Y/4)=0. Therefore, the second addresses (Q(X/4)+1=1) of the image memories $IM_1$ and $IM_2$ are accessed, respectively, and the respective pixel data of (4,0) and (5,0) are output from the image memories $IM_1$ and $IM_2$ to the sorter. On the other hand, the first addresses (Q(X/4)=0) of the image memories $IM_3$ and $IM_4$ are accessed, respectively, and the respective pixel data of (2,0) and (3,0) are output to the sorter. Since the horizontal sorter 504 are set to the third-input selection state when R(X/4)=2, the parallel pixel data of (4,0), (5,0), (2,0) and (3,0) are sorter into consecutive parallel image data $P_{IM3}$ of (2,0), (3,0), (4,0) and (5,0) which are output to the filter 505. It is the same with other read positions. In this manner, the 4×4-tap two-dimensional filtering of the input image data can be achieved.

As described above, consecutive parallel image line data or pixel data can be obtained without the need of line buffers, flip-flops or output buffer. Further, only desired image data are used to produce consecutive parallel data to be filtered.

What is claimed is:

1. A memory control system comprising:
   a frame memory divided into N image memories each indicated by $IM_I$ where N and I are integers and $0 \leq I \leq N-1$;
   a write controller for sequentially writing serial image data onto the N image memories in rotation; the serial image data written onto the N image memories being such that K-th image data is written onto an image memory $IM_I$ so as to satisfy K=N×Q(K/N)+I, where Q(K/N) is a quotient of K/N; and
   a read controller for concurrently reading image data from each of the N image memories depending on a desired read position to produce consecutive N image data in parallel.

2. The memory control system according to claim 1, wherein the read controller reads P-th image data from the image memory $IM_I$ such that P is one selected from $$Q(P/N) \text{ and } Q(P/N)+1$$

depending on R(P/N), where R(P/N) is a remainder of P/N.

3. A memory control system comprising:
   a frame memory divided into N image memories each indicated by $IM_I$ where N and I are integers and $0 \leq I \leq N-1$;

a write controller sequentially writing serial image data onto the N image memories in rotation;

a read controller for concurrently reading image data from each of the N image memories depending on a desired read position to produce consecutive N image data in parallel, wherein the read controller comprises:

a memory read controller for concurrently reading image data from each of the N image memories to produce N image data in parallel; and a sorter for sorting the N image data to produce consecutive N image data in parallel.

4. The memory control system according to claim 3, wherein the write controller sequentially writes the serial image data onto the N image memories such that K-th image data is written onto an image memory $IM_I$ so as to satisfy $K=N\times Q(K/N)+I$, where $Q(K/N)$ is a quotient of K/N, the memory read controller reads P-th image data from the image memory $IM_I$ such that P is one selected from $Q(P/N)$ and $Q(P/N)+1$ depending on $R(P/N)$, where $R(P/N)$ is a remainder of P/N, and the sorter sorts the N image data depending on $R(P/N)$.

5. A memory control system comprising:

frame memory means which is divided in an X-direction by M and is further divided in a Y-direction by N in order to form memories divided into M×N memories, each of said memories being indicated by $IM_{(I, J)}$, where M, N, I and J are integers, $0 \leq I \leq M-1$ and $0 \leq I \leq N-1$;

write controller means for sequentially writing serial image data D (X, Y) onto the M×N image memories in rotation, wherein a set of X and Y indicates a position of a frame of input image data; wherein the serial image data written onto the M×N image memories is such that image data D (X, Y) is written onto an image memory $IM_{(I, J)}$ so as to satisfy $$X=M\times Q(X/M)+I \text{ and}$$

$$Y=N\times Q(Y/N)+J,$$

where $Q(X/M)$ and $Q(Y/N)$ are quotients of X/M and Y/N, respectively, and read controller means for concurrently reading image data from each of the M×N image memories depending on a desired read position in order to produce consecutive M×N image data in parallel.

6. The memory control system according to claim 5, wherein the read controller reads image data D(X, Y) from the image memory image memory $IM_{(I, J)}$ such that X is one selected from $Q(X/M)$ and $Q(X/M)+1$ depending on $R(X/M)$ and Y is one selected from $Q(Y/N)$ and $Q(Y/N)+1$ depending on $R(Y/N)$, where $R(X/M)$ and $R(Y/N)$ are remainders of X/M and Y/N, respectively.

7. A control method for a frame memory divided into N image memories each indicated by $IM_I$ where N and I are integers and $0 \leq I \leq N-1$, comprising the steps of:

a) sequentially writing serial image data onto the N image memories in rotation; wherein, the serial image data are sequentially written onto the N image memories such that K-th image data is written onto an image memory $IM_I$ so as to satisfy $K=N\times Q(K/N)+I$, where $Q(K/N)$ is a quotient of K/N;

b) concurrently reading image data from each of the N image memories depending on a desired read position to produce consecutive N image data in parallel.

8. The control method according to claim 7, wherein, in the step b), P-th image data is read from the image memory $IM_I$ such that P is one selected from $Q(P/N)$ and $Q(P/N)+1$ depending on $R(P/N)$, where $R(P/N)$ is a remainder of P/N.

9. A control method for a frame memory divided into N image memories each indicated by $IM_I$, where N and I are integers and $0 \leq I \leq N-1$, comprising the steps of:

a) sequentially writing serial image data onto the N image memories in rotation;

b) concurrently reading image data from each of the N image memories depending on a desired read position to produce consecutive N image data in parallel, wherein step b) comprises the steps of:

b-1) concurrently reading image data from each of the N image memories to produce N image data in parallel; and b-2 sorting the N image data to produce consecutive N image data in parallel.

10. The control method according to claim 9, wherein in the step a), the serial image data are sequentially written onto the N image memories such that K-th image data is written onto an image memory $IM_I$ so as to satisfy $K=N\times Q(K/N)+I$, where $Q(K/N)$ is a quotient of K/N, in the step b-1), P-th image data is read from the image memory $IM_I$ such that P is one selected from $Q(P/N)$ and $Q(P/N)$ +1 depending on $R(P/N)$, where $R(P/N)$ is a remainder of P/N, and in the step b-2), the N image data are sorted depending on $R(P/N)$.

* * * * *